United States Patent
Kasilya Sudarsan et al.

(10) Patent No.: US 10,079,030 B2
(45) Date of Patent: Sep. 18, 2018

(54) SYSTEM AND METHOD TO PROVIDE AN ALERT USING MICROPHONE ACTIVATION

(71) Applicant: QUALCOMM Incorporated, San Diego, CA (US)

(72) Inventors: Vishnu Vardhan Kasilya Sudarsan, Telangana (IN); Raja Chitikela, Telangana (IN); Debesh Kumar Sahu, Telangana (IN); Chaitanya Sarayavalasa, Telangana (IN)

(73) Assignee: Qualcomm Incorporated, San Diego, CA (US)

( * ) Notice: Subject to any disclaimer, the term of this patent is extended or adjusted under 35 U.S.C. 154(b) by 94 days.

(21) Appl. No.: 15/232,717

(22) Filed: Aug. 9, 2016

(65) Prior Publication Data
US 2018/0047414 A1    Feb. 15, 2018

(51) Int. Cl.
| | |
|---|---|
| G10L 25/51 | (2013.01) |
| G10L 25/15 | (2013.01) |
| H04R 29/00 | (2006.01) |
| G06F 3/16 | (2006.01) |
| G08B 21/18 | (2006.01) |

(52) U.S. Cl.
CPC .............. *G10L 25/51* (2013.01); *G06F 3/165* (2013.01); *G08B 21/18* (2013.01); *G10L 25/15* (2013.01); *H04R 29/001* (2013.01); *H04R 2460/07* (2013.01)

(58) Field of Classification Search
CPC ............... H04R 29/00; H04R 2430/01; H04R 2499/11; H03G 3/32; G06F 3/165; G10L 25/51
See application file for complete search history.

(56) References Cited

U.S. PATENT DOCUMENTS

| | | | |
|---|---|---|---|
| 8,150,044 B2 | 4/2012 | Goldstein et al. | |
| 8,194,865 B2 | 6/2012 | Goldstein et al. | |
| 8,620,653 B2 | 12/2013 | Cutler | |
| 8,804,974 B1 * | 8/2014 | Melanson | H03G 3/32 |
| | | | 381/57 |
| 9,444,422 B2 * | 9/2016 | Bharj | H03G 1/02 |

(Continued)

FOREIGN PATENT DOCUMENTS

| | | |
|---|---|---|
| EP | 2966642 A2 | 1/2016 |
| WO | 2016055920 A2 | 4/2016 |

OTHER PUBLICATIONS

International Search Report and Written Opinion—PCT/US2017/041725—ISA/EPO—dated Oct. 17, 2017.

*Primary Examiner* — Nafiz E Hoque
(74) *Attorney, Agent, or Firm* — Arent Fox LLP and Qualcomm, Incorporated

(57) ABSTRACT

A device may be configured to alert a user while the user is listening to audio over headphones. For example, the device may be configured to alert the user of the device, such as by reducing the volume of an audio signal output through the headphones and/or by providing a visual alert to the user on a display of the device. The device may compare a volume level of an outputted audio signal to a threshold. The device may activate a microphone based on the comparison of the volume level to the threshold. When the microphone is activated, the device may provide an alert to a user based on a determination that a received audio signal includes a portion that corresponds to a predetermined value.

27 Claims, 10 Drawing Sheets

(56) References Cited

U.S. PATENT DOCUMENTS

2007/0189544 A1* 8/2007 Rosenberg ........... G11B 27/105
  381/57
2014/0064511 A1 3/2014 Desai
2016/0269841 A1* 9/2016 Shinde .................... G08B 1/08

* cited by examiner

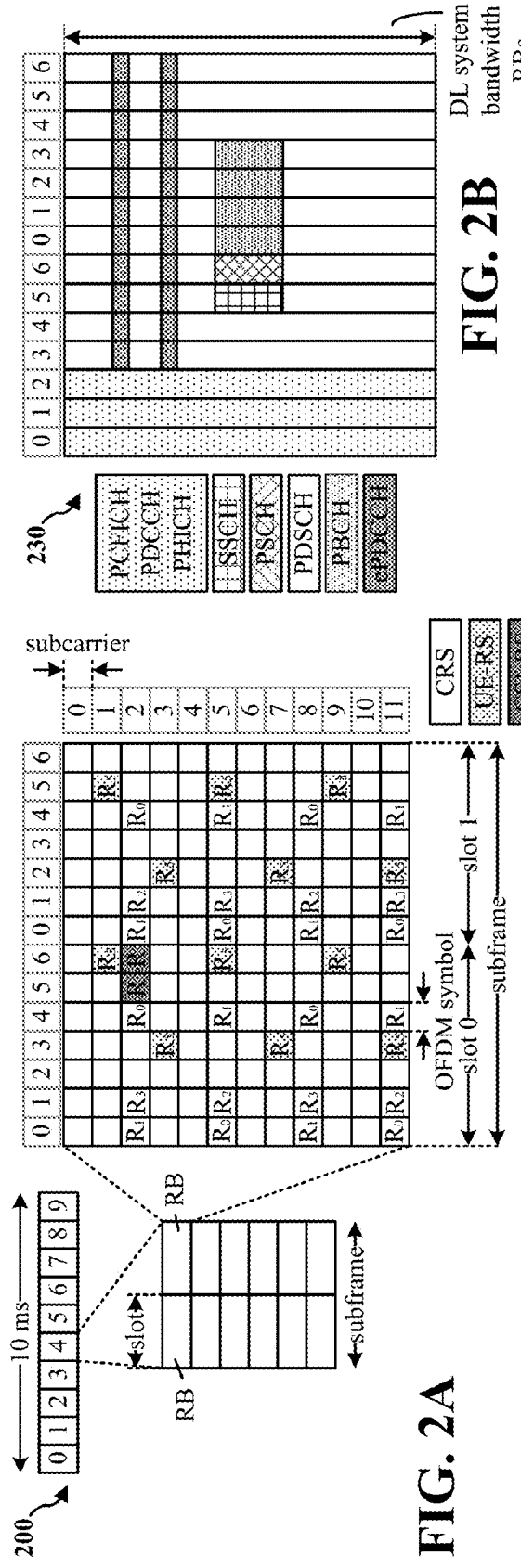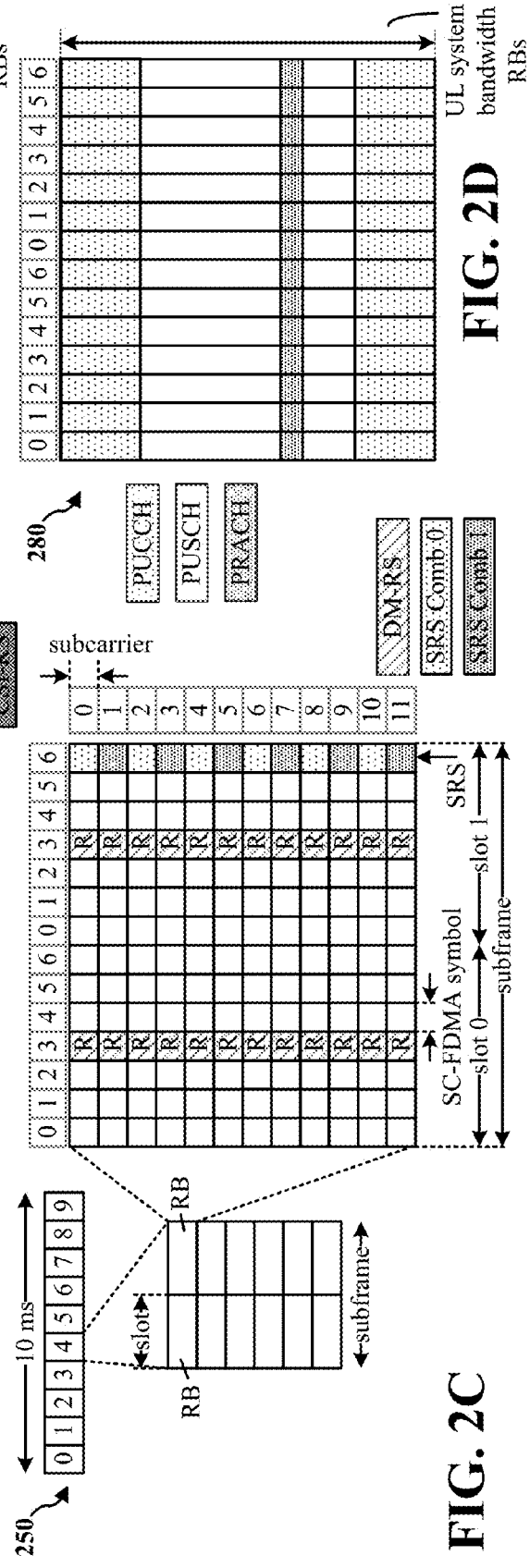
FIG. 2A  FIG. 2B  FIG. 2C  FIG. 2D

SYSTEM AND METHOD TO PROVIDE AN ALERT USING MICROPHONE ACTIVATION

BACKGROUND

Field

The present disclosure relates generally to communication systems, and more particularly, to a device configured to generate an alert when the device is outputting an audio signal through headphones.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is Long Term Evolution (LTE). LTE is a set of enhancements to the Universal Mobile Telecommunications System (UMTS) mobile standard promulgated by Third Generation Partnership Project (3GPP). LTE is designed to support mobile broadband access through improved spectral efficiency, lowered costs, and improved services using OFDMA on the downlink, SC-FDMA on the uplink, and multiple-input multiple-output (MIMO) antenna technology. However, as the demand for mobile broadband access continues to increase, there exists a need for further improvements in LTE technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Frequently, users wear headphones to listen to audio, such as when a user is listening to music, engaged in a voice or video call, and the like. The use of headphones by the user may impede the ability of the user to hear surrounding sound that may be of interest to the user. For example, when listening to audio over headphones, a user may be unable to hear another individual that is attempting to notify the user. Similarly, when listening to audio over headphones, a user may be unable to hear announcements over a loudspeaker when the user is in an airport, railway station, and the like. In order to the user to hear surrounding sound, the user may manually reduce the volume of the audio output through the headphones or remove the headphones. Correspondingly, the user may manually increase the volume of the audio output through the headphones or replace the headphones after the user hears the surrounding sound As described herein, a device may be configured to generate an alert a user when audio is sent to headphones while the user is listening to audio over headphones. For example, the device may be configured to alert the user of the device, such as by reducing the volume of an audio signal output through the headphones and/or by providing a visual alert to the user on a display of the device. Such an approach may require that the device perpetually monitor an audio signal received through a microphone communicatively coupled with the device.

Constantly monitoring a received audio signal may consume resources of the device, such as processor cycles and/or power (e.g., battery power). Further, the device may not need to constantly receive ambient noise in order to effectively detect a relevant sound. For example, when the headphones output an audio signal that is below a threshold margin, the user is likely able to hear ambient noise and so may hear relevant sounds without being alerted by the device. Thus, to conserve resources of a device, the device may activate and deactivate a microphone to monitor ambient noise for a relevant sound (e.g., an announcement, a name of the user).

In an aspect of the disclosure, a method, a computer-readable medium, and an apparatus are provided. The apparatus may be configured to compare a volume level to a threshold, and the volume level may be associated with output of a first audio signal by the apparatus. The apparatus may be further configured to activate a microphone communicatively coupled to the apparatus based on the comparison of the volume level to the threshold. When the microphone is activated, the apparatus may be configured to receive, through the microphone, a second audio signal when the apparatus is outputting the first audio signal. The apparatus may be configured to determine that the second audio signal includes a first portion that corresponds to a predetermined value. The apparatus may be further configured to provide an alert to a user of the apparatus based on the determination that the second audio signal includes the first portion that corresponds to the predetermined value.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 2A, 2B, 2C, and 2D are diagrams illustrating LTE examples of a DL frame structure, DL channels within the DL frame structure, an UL frame structure, and UL channels within the UL frame structure, respectively.

DETAILED DESCRIPTION

Figure 1:
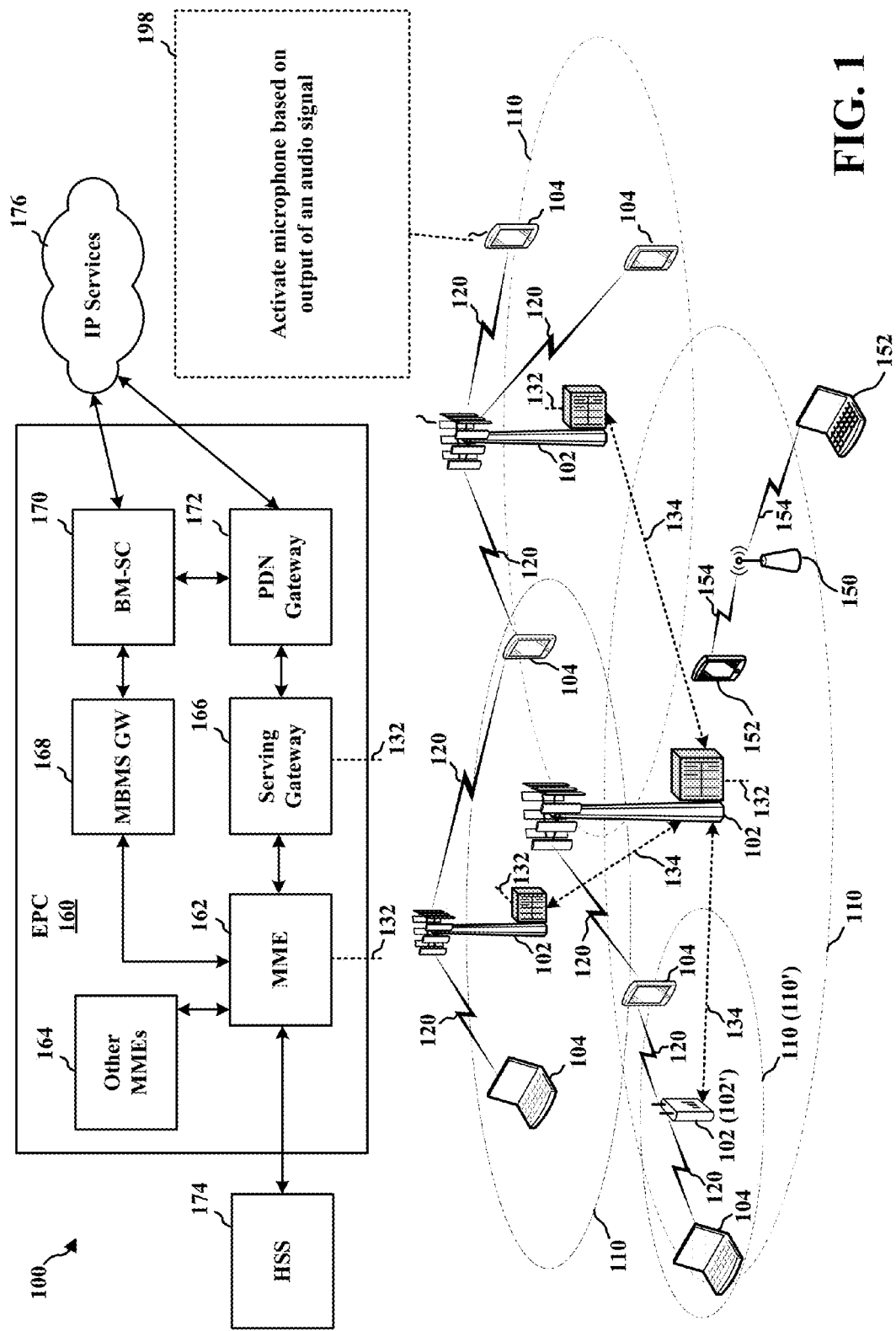
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include eNBs. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links may be through one or more carriers. The base stations 102/UEs 104 may use spectrum up to Y MHz (e.g., 5, 10, 15, 20 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ LTE and use the same 5 GHz unlicensed frequency spectrum as used by the Wi-Fi AP 150. The small cell 102', employing LTE in an unlicensed frequency spectrum, may boost coverage to and/or increase capacity of the access network. LTE in an unlicensed spectrum may be referred to as LTE-unlicensed (LTE-U), licensed assisted access (LAA), or MuLTEfire.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, or any other similar functioning device. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 may be configured to activate a microphone 198 based on output of an audio signal. That is, the UE 104 may include a microphone 198. The UE 104 may output an audio signal through headphones communicatively coupled to the UE 104. Based on the output of the audio signal, the UE 104 may selectively activate/deactivate a microphone 198 communicatively coupled to the UE 104 (e.g., a microphone integrated into the headphones). When the microphone 198 is activated, the UE 104 may be configured to monitor an audio signal received through the microphone 198 and determine if the received audio signal includes a relevant sound, such as an announcement or a name. When the UE 104 detects the relevant sound, the UE 104 may be configured to provide an alert, such as to alert a user of the UE 104.

FIG. 2A is a diagram 200 illustrating an example of a DL frame structure in LTE. FIG. 2B is a diagram 230 illustrating an example of channels within the DL frame structure in LTE. FIG. 2C is a diagram 250 illustrating an example of an UL frame structure in LTE. FIG. 2D is a diagram 280 illustrating an example of channels within the UL frame structure in LTE. Other wireless communication technologies may have a different frame structure and/or different channels. In LTE, a frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). In LTE, for a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) is within symbol 6 of slot 0 within subframes 0 and 5 of a frame, and carries a primary synchronization signal (PSS) that is used by a UE to determine subframe timing and a physical layer identity. The secondary synchronization channel (SSCH) is within symbol 5 of slot 0 within subframes 0 and 5 of a frame, and carries a secondary synchronization signal (SSS) that is used by a UE to determine a physical layer cell identity group number. Based on the physical layer identity and the physical layer cell identity group number, the UE can determine a physical cell identifier (PCI). Based on the PCI, the UE can determine the locations of the aforementioned DL-RS. The physical broadcast channel (PBCH) is within symbols 0, 1, 2, 3 of slot 1 of subframe 0 of a frame, and carries a master information block (MIB). The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the eNB. The UE may additionally transmit sounding reference signals (SRS) in the last symbol of a subframe. The SRS may have a comb structure, and a UE may transmit SRS on one of the combs. The SRS may be used by an eNB for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
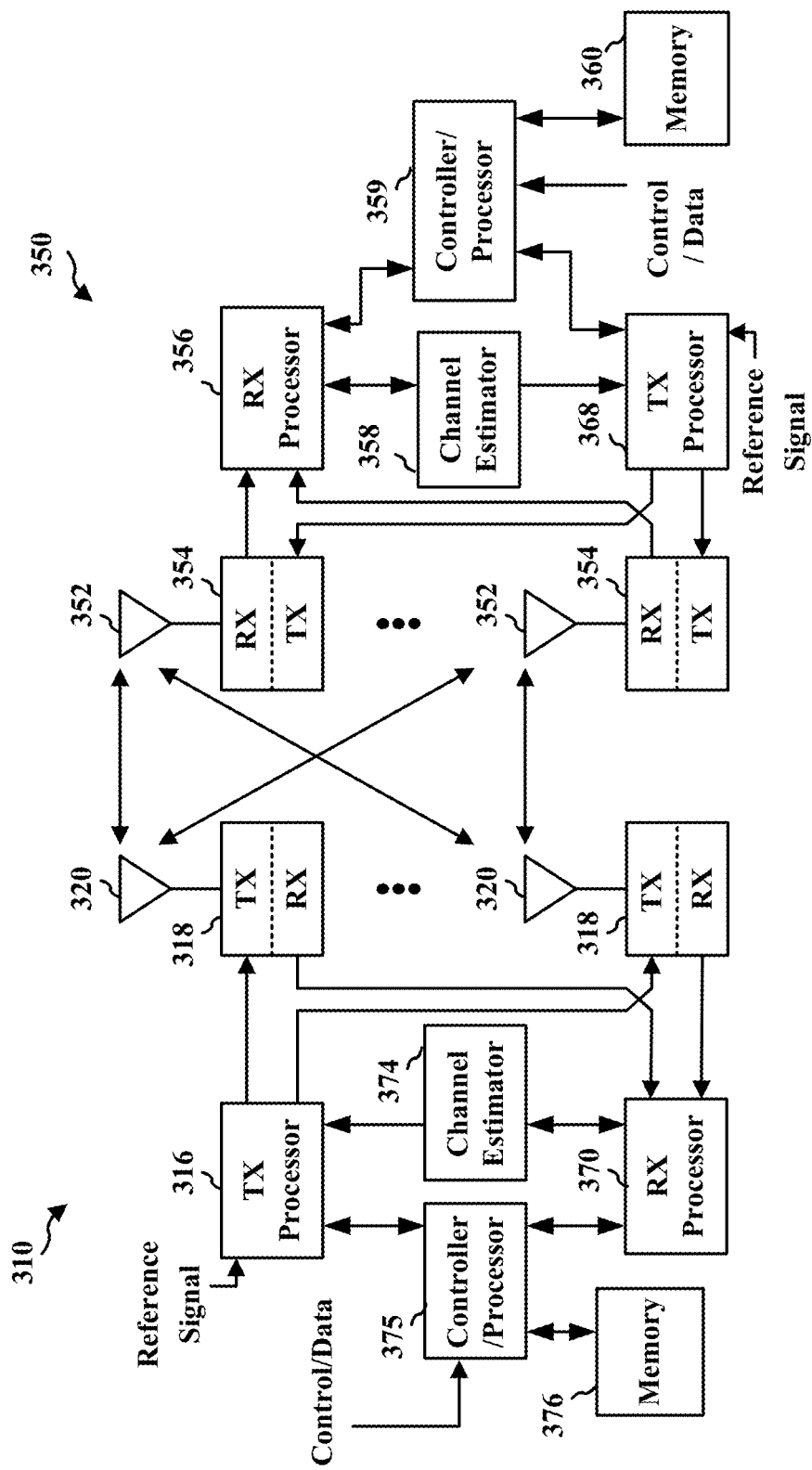
FIG. 3 is a diagram illustrating an example of an evolved Node B (eNB) and user equipment (UE) in an access network.

FIG. 3 is a block diagram of an eNB 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demuliplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the eNB 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demuliplexing of MAC SDUs from TBs, scheduling information reporting, error correction through HARQ, priority handling, and logical channel prioritization.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Figure 4:
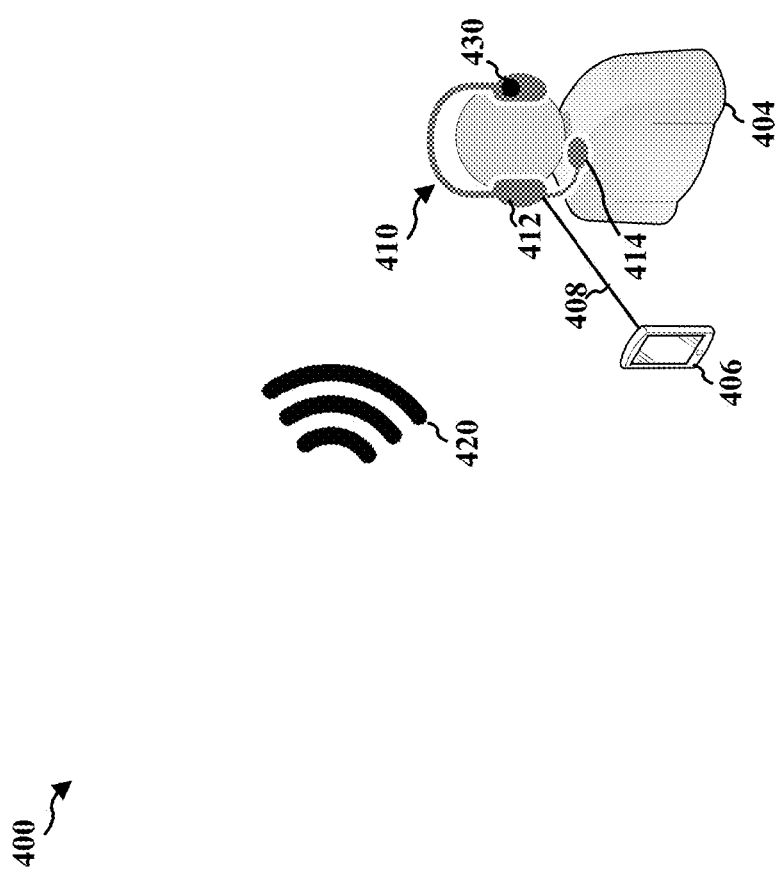
FIG. 4 is a diagram of an environment in which a device may be configured to alert a user when the device is outputting an audio signal through headphones.

FIG. 4 is a diagram of an environment 400 in which a device 406 may be configured to alert a user 404 when the device 406 is outputting an audio signal through a speaker 412 of headphones 410. In the environment 400, a user 404 may be wearing headphones 410. The headphones 410 may include at least one speaker 412 and a first microphone 414. In some aspects, the headphones 410 may include a second microphone 430.

In an aspect, the headphones 410 may be communicatively coupled to a device 406 (e.g., the UE 104, a portable music player, and the like) through connection 408. The connection 408 may be any suitable connection capable of carrying an audio signal, including any wired or wireless connections, such as Bluetooth or an optical connection. The connection 408 allows the device 406 to send an audio signal to the headphones 410, which is output through the speaker 412. Similarly, the connection 408 allows the headphones 410 to send an audio signal to the device 406, such as an audio signal received through the first microphone 414. While aspects described herein may be described in the context of headphones connected to a device, the present disclosure comprehends aspects in which various operations are performed by the headphones 410 (e.g., where the headphones 410 include processing circuitry configured to execute instructions to perform the operations described herein) and/or by the device 406 (e.g., where the first microphone 414 and/or the second microphone 430 are incorporated in the device 406).

The device 406 may be configured to alert the user 404 while the user 404 is listening to an audio signal output through a speaker 412. According to aspects, the device 406 may be configured to monitor ambient noise (e.g., noise in the surrounding environment 400) for a relevant sound 420. The relevant sound 420 may be an announcement, a name of the user 404, or some other sound that may be of interest to the user 404. For example, the relevant sound 420 may be a word or phrase that often introduces an announcement, such as "Ladies and Gentlemen," "Your kind attention please," and the like. Similarly, the relevant sound 420 may be a name of the user 404, such as "Jack" or another name.

In an aspect, the device 406 may be configured with one or more values to which the relevant sound 420 corresponds. In an aspect, a value may be a text pattern—for example, a string representing an announcement, a name, or another sound of interest.

In an aspect, the device 406 may receive input (e.g., from the user 404) to configure the one or more values. Thus, in one aspect, the one or more values may be text values. In an aspect, the device 406 may be configured to convert the one or more values into one or more languages. Thus, the device 406 may be able to generate an alert in different regions or locales even when the device 406 receives values in a language that is not used in such regions or locales.

In an aspect, the microphone 414 may receive an audio signal that includes the relevant sound 420. The microphone 414 may provide the received audio signal to the device 406 through the connection 408. The device 406 may be configured to process the audio signal to detect the relevant sound 420—that is, the device 406 may be configured to determine that the audio signal received through the microphone 414 includes a first portion (e.g., the relevant sound 420) that corresponds to at least one predetermined value (e.g., a user-configured value or another stored value).

In one aspect, the device 406 may be communicatively coupled with the a plurality of microphones, including at least the first microphone 414 and the second microphone 430. Because one microphone may be occluded, the device 406 may be configured to select one of the microphones 414, 430 to use for detection of the relevant sound 420. For example, the device 406 may measure a first volume or noise level received through the first microphone 414 and also measure a second volume or noise level received through the second microphone 430, and the device 406 may select the one of the microphones 414, 430 having a greater volume or noise level, which may indicate less occlusion. In another example, the device 406 may attempt to convert to a text pattern a first audio signal received through the first microphone 414 and, similarly, attempt to convert to a text pattern a second audio signal received through the second microphone 430. The device 406 may determine which conversion is more accurate or more likely to be correct and select the corresponding one of the microphones 414, 430. Although aspects described herein may reference the first microphone 414, the present disclosure comprehends aspects in which the second microphone 430 performs same or similar operations when selected (e.g., the second microphone 430 may be selectively activated/deactivated based on comparison of a volume level to a threshold).

The device 406 may be configured to determine whether the received audio signal includes the relevant sound 420 that corresponds to at least one value according to any suitable approach. In an aspect, the device 406 may be configured to convert the relevant sound 420 to a text pattern (e.g., a string value or an array of characters). The device 406 may be configured to compare the received text pattern to one or more stored values that are text patterns. If the device 406 determines that the received text pattern corresponds to at least one stored text pattern, the device 406 may provide an alert to the user 404. In aspects, the device 406 may determine that the received text pattern corresponds to at least one stored text pattern using any suitable approach. Thus, the device 406 may determine that the received text pattern corresponds to at least one stored text pattern where the received text pattern does not exactly match the stored text pattern, but is within a threshold margin of error. For example, the device 406 may be configured to convert the relevant sound 420 to a text pattern and if greater than 75% of the received text pattern matches a stored text pattern, then the device 406 may provide an alert to the user 404.

In an aspect, the device 406 may buffer at least a portion of the received audio signal when determining whether the received audio signal includes the relevant sound 420 that corresponds to a stored value. The buffer may be based on a timer (e.g., the device 406 may buffer ten seconds of the received audio signal) and/or a capacity (e.g., the device 406 may buffer received audio signal so that a preceding duration is stored, such as the previous ten seconds). In another aspect, the device 406 may buffer data to cover processing time commensurate with determining whether the buffered data includes the relevant sound 420.

The alert provided by the device 406 may be any alert suitable to inform the user 404 of the relevant sound 420. In an aspect, the device 406 may alert the user 404 by reducing a volume of audio signal output through the speaker 412 or stopping the output of the audio signal through the speaker 412. In another aspect, the device 406 may alert the user 404 by presenting a visual alert on a display of the device 406. In another aspect, the device 406 may alert the user 404 by causing a light associated with the headphones 410 and/or the device 406 to flash (e.g., a light-emitting diode (LED)) included in a housing of the device 406 or the headphones 410. In another aspect, the device 406 may generate a vibration alert—e.g., the device 406 may alert the user 404 by causing the device 406 and/or the headphones 410 to vibrate.

In one aspect, the device 406 may generate an audio alert. For example, the device 406 alert the user 404 by playing back at least a portion of the audio signal received through the microphone 414 through the speaker 412. For example, the device 406 may buffer the received audio signal (e.g., when determining whether the received audio signal includes the relevant sound 420) and, when the device 406 determines that the received audio signal includes the relevant sound 420, the device 406 may play back at least a portion of the buffered audio through the speaker 412 of the headphones 410 (including at least the relevant sound 420 and, optionally, a portion of the buffered audio signal following the relevant sound 420). In this way, the user 404 may be able to hear the relevant sound 420 even when the user 404 is listening to audio through the speaker 412. In an aspect, the device 406 may provide one or more of the alerts simultaneously or contemporaneously—e.g., the device 406 may stop output of the current audio signal through the speaker 412, and instead output the received audio signal (that includes the relevant sound 420).

Constantly monitoring an audio signal received through the microphone 414 may consume resources of the device 406, such as processor cycles and/or power (e.g., battery power). Further, the device 406 may not need to constantly receive ambient noise in order to detect the relevant sound 420. Thus, the device 406 may be configured to selectively activate and deactivate the microphone. In various aspects, activation of the microphone 414 may refer to a state in which the device 406 is monitoring an audio signal received through the microphone 414. This state may vary according to different aspects, e.g., the device 406 may activate the microphone 414 by causing power to be supplied to the microphone 414 and/or the device 406 may activate the microphone 414 by monitoring audio signals received through the microphone 414. Similarly, deactivation of the microphone 414 may refer to a state in which the device 406 is not monitoring an audio signal received through the microphone 414. This deactivation state may vary according to different aspects, e.g., the device 406 may deactivate the microphone 414 by refraining from causing power to be supplied to the microphone 414 and/or the device 406 may deactivate the microphone 414 by refraining from monitoring audio signals received through the microphone 414.

According to aspects, the device 406 may be configured to determine a volume level associated with an audio signal output through the speaker 412 of the headphones 410. For example, the device 406 may determine a power level of sound or a peak voltage level of sound. In another example, the device 406 may access a stored value that indicates a configurable value for volume (e.g., a user-configured volume level). The device 406 may be configured to compare the volume level associated with the audio signal to a threshold. Based on the comparison of the volume level to the threshold, the device 406 may be configured to either activate or deactivate the microphone. For example, when the speaker 412 outputs an audio signal having a volume that is below a threshold, the user 404 may be able to hear ambient noise (e.g., background sound) and so may hear relevant sounds without being alerted by the device. Thus, to conserve resources, the device 406 may deactivate the microphone 414 (and therefore refrain from monitoring ambient noise for the relevant sound 420). Similarly, when the speaker 412 outputs an audio signal having a volume that meets or exceeds the threshold, the user 404 may not be able to hear ambient noise and so the device 406 may generate an alert when the relevant sound 420 is detected. Accordingly, the device 406 may activate the microphone 414 and monitor ambient noise for the relevant sound 420.

In one aspect, the device 406 may selectively activate and deactivate the microphone based on the amplitude of an audio signal that is output through the speaker 412. For example, when the speaker 412 outputs an audio signal having an amplitude that is below a threshold, the user 404 may be able to hear ambient noise and so may hear relevant sounds without being alerted by the device. Thus, to conserve resources of a device, the device 406 may deactivate the first microphone 414 (and therefore refrain from monitoring ambient noise for the relevant sound 420). Similarly, when the speaker 412 outputs an audio signal having an amplitude that meets or exceeds the threshold, the user 404 may not be able to hear ambient noise and so the device 406 may provide an alert to the user 404 when the relevant sound 420 is detected. Accordingly, the device 406 may activate the microphone 414 and monitor ambient noise for the relevant sound 420.

In one aspect, the device 406 may determine a waveform associated with an audio signal that is output through the speaker 412. For example, the device 406 may determine a waveform of an audio file or a portion of an audio file (e.g., a music file, a video file, a voice memo, etc.) that is output through the speaker 412. For example, each audio file may be represented by a waveform stored in the device 406. The waveform may reflect oscillations between relatively greater and relatively lower amplitudes. When the waveform has an amplitude that is below a threshold, the user 404 is likely able to hear ambient noise and so may hear relevant sounds without being alerted by the device. Thus, to conserve resources of a device, the device 406 may deactivate the microphone 414 (and therefore refrain from monitoring ambient noise for the relevant sound 420). Similarly, when the speaker 412 outputs an audio signal having an amplitude that meets or exceeds the threshold, the user 404 is unlikely to able to hear ambient noise and so the device 406 may provide an alert to the user 404 when the relevant sound 420 is detected. Accordingly, the device 406 may activate the microphone 414 and monitor ambient noise for the relevant sound 420.

According to an aspect, the device 406 may be further configured to determine a second volume level, which may be associated with the audio signal received through the microphone 414. That is, the device 406 may determine a volume or noise level of the ambient noise (which may include the relevant sound 420 at one point). The device 406 may be configured to compare the second volume level to a second threshold. Based on the comparison of the second volume level to the second threshold, the device 406 may be configured to either activate or deactivate the microphone. For example, when the microphone 414 receives an audio signal having a volume that meets or exceeds the second threshold, the user 404 is likely able to hear ambient noise and so may hear relevant sounds without being alerted by the device. Thus, to conserve resources of a device, the device 406 may deactivate the microphone 414 (and therefore refrain from monitoring ambient noise for the relevant sound 420). Similarly, when the microphone 414 receives an audio signal having a volume that does not meet or exceed the second threshold, the user 404 is unlikely to able to hear ambient noise and so the device 406 may provide an alert to the user 404 when the relevant sound 420 is detected. Accordingly, the device 406 may activate the microphone 414 and monitor ambient noise for the relevant sound 420.

In an aspect, the device 406 may activate and/or deactivate the microphone 414 based on one or more timers. For example, after activation or deactivation of the microphone 414, the device 406 may wait a predetermined period of time (e.g., as defined by a timer) before again determining a volume level to compare to a threshold.

In one aspect, the device 406 may activate the microphone 414 when a volume level associated with an audio signal output through the speaker 412 meets or exceeds the first threshold. The device 406 may then begin countdown of a first timer. The microphone may remain activated for the duration of the timer. At expiration of the first timer, the device 406 may again determine a volume level associated with an audio signal output through the speaker 412 and either deactivate or continue activation of the microphone 414 based on the comparison of the volume level to the threshold.

In one aspect, the device 406 may deactivate the microphone 414 when the volume level associated with an audio signal received through the microphone 414 meets or exceeds the second threshold. The device 406 may then begin countdown of a second timer. The microphone may remain deactivated for the duration of the timer. At expiration of the second timer, the device 406 may activate the microphone 414 and again determine a volume level associated with an audio signal received through the microphone 414 and either deactivate or continue activation of the microphone 414 based on the comparison of the volume level to the threshold.

In an aspect, the device 406 may activate or deactivate the microphone based on one or more other parameters determined by the device 406 (e.g., a location of the device). The relevant sound 420 may not be germane in all contexts and, therefore, the device 406 may deactivate the microphone when one or more of the other parameters are not satisfied. For example, the relevant sound 420 may occur in a transit station, such as an airport or railway station (e.g., the relevant sound 420 may preface a boarding announcement, such as "attention please") and, therefore, the device 406 may not monitor for the relevant sound 420 when the device 406 is not located in a transit station. In one aspect, the device 406 may determine a location of the device 406 and determine whether to activate the microphone 414 based on the location of the device 406. The device 406 may determine the location of the device 406 using any suitable approach, such as a global positioning system (GPS), a WiFi positioning system, or some other approach. The device 406 may determine whether the location matches any location in a set of locations stored in the device 406 (e.g., a list configured by a user, a preconfigured list, etc.) and, if so, the device 406 may activate the microphone.

Figure 5:
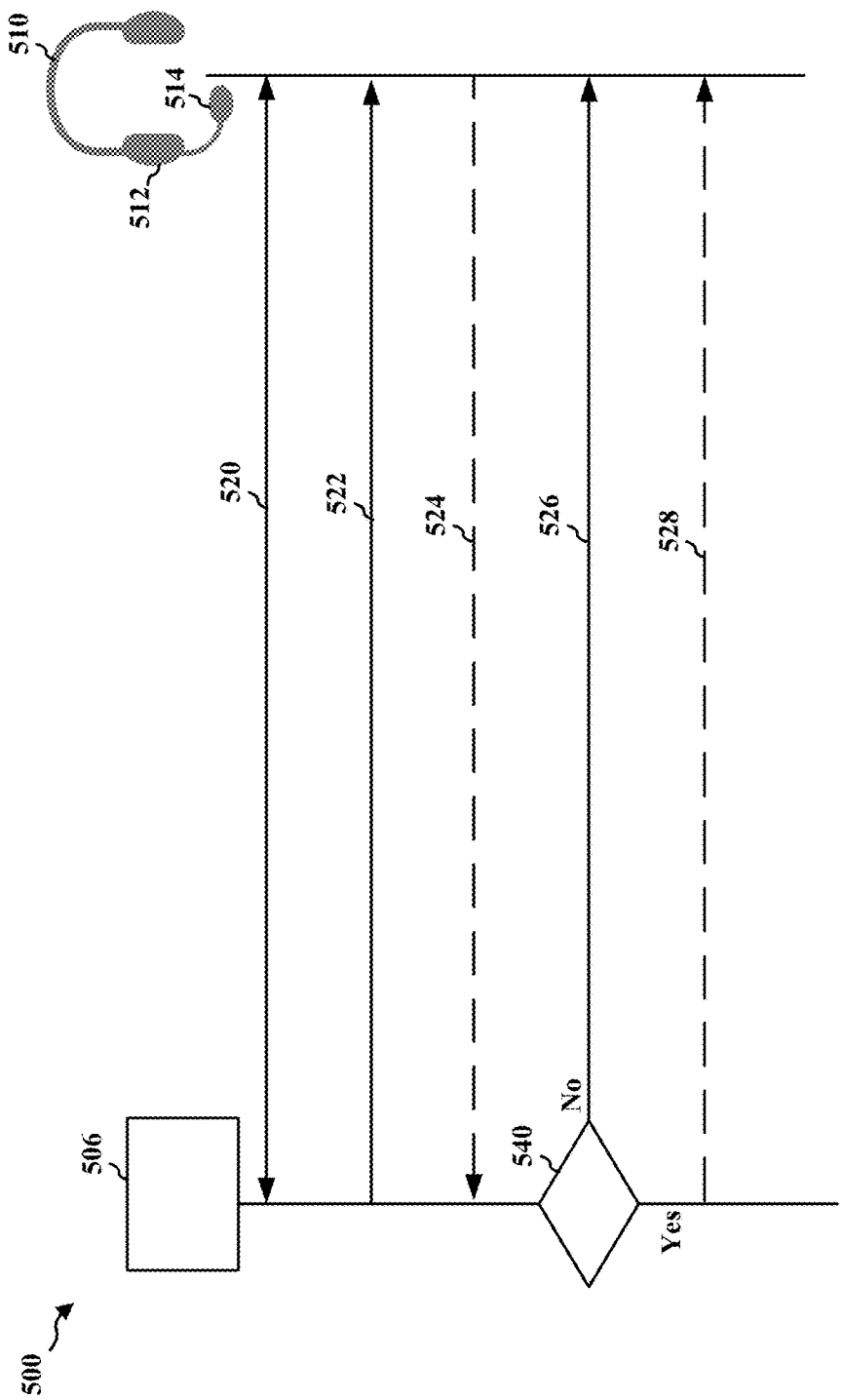
FIG. 5 is a call flow diagram of a device that may alert a user when the device is outputting an audio signal through headphones.

FIG. 5 is a call flow diagram of a device 506 that may alert a user when the device 506 is outputting an audio signal through headphones 510. In an aspect, the device 506 may be an aspect of the device 406 and/or the headphones 510 may be an aspect of the headphones 410.

At operation 520, the device 506 may be connected to the headphones 510 and the device 506 may cause a speaker 512 of the headphones 510 to output an audio signal. In the context of FIG. 4, the device 406 may be connected to the headphones 410 through connection 408, and the device 406 may cause the speaker 412 to output an audio signal.

At operation 522, the device 506 may compare a volume level of this outputted audio signal to a threshold. Based on the comparison of the volume level to the threshold, the device 506 may activate the microphone 514—e.g., if the volume level meets or exceeds the threshold, the device 506 may activate the microphone 514. In the context of FIG. 4, the device 406 may activate the microphone 414 of the headphones 410 when a volume level of an audio signal output through the speaker 412 exceeds a first threshold.

At operation 524, the microphone 514 may receive an audio signal and provide that audio signal to the device 506. The device 506 may attempt to convert at least a portion of the audio signal to a text pattern. For example, the device 506 may detect or isolate voice audio from ambient noise audio in the received audio signal, and attempt to convert the voice audio to a text pattern (e.g., using a voice-to-text conversion algorithm included in a component of the device 506). In the context of FIG. 4, the microphone 414 may receive an audio signal and provide the received audio signal to the device 406. The device 406 may attempt to convert at least a portion of the received audio signal to a text pattern.

At operation 540, the device 506 may compare the converted text pattern (i.e., the text pattern converted from the received audio) to one or more stored values (e.g., one or more stored text patterns). In the context of FIG. 4, the device 406 may compare a text pattern converted from a received audio signal to one or more stored text patterns.

If the converted text pattern does not correspond to any stored values, the device 506 may proceed to operation 526. At operation 526, the device 506 may continue to monitor ambient noise received through the microphone 514. In the context of FIG. 4, the device 406 may continue to monitor ambient noise received through the microphone 414 for the relevant sound 420.

If the converted text pattern corresponds to at least one stored value, the device 506 may proceed to operation 528. At operation 528, the device 506 may provide an alert through the headphones 510 indicating that the device 506 detected a relevant sound in a received audio signal. For example, the device 506 may reduce the volume level of the audio signal being output through the speaker 512 and/or the device 506 may cause at least a portion of the received audio signal to be played back through the speaker 512 (e.g., a portion corresponding to the isolated and/or detected voice). In the context of FIG. 4, the device 406 may provide an alert through the headphones 410 indicating detection of the relevant sound 420.

Figure 6:
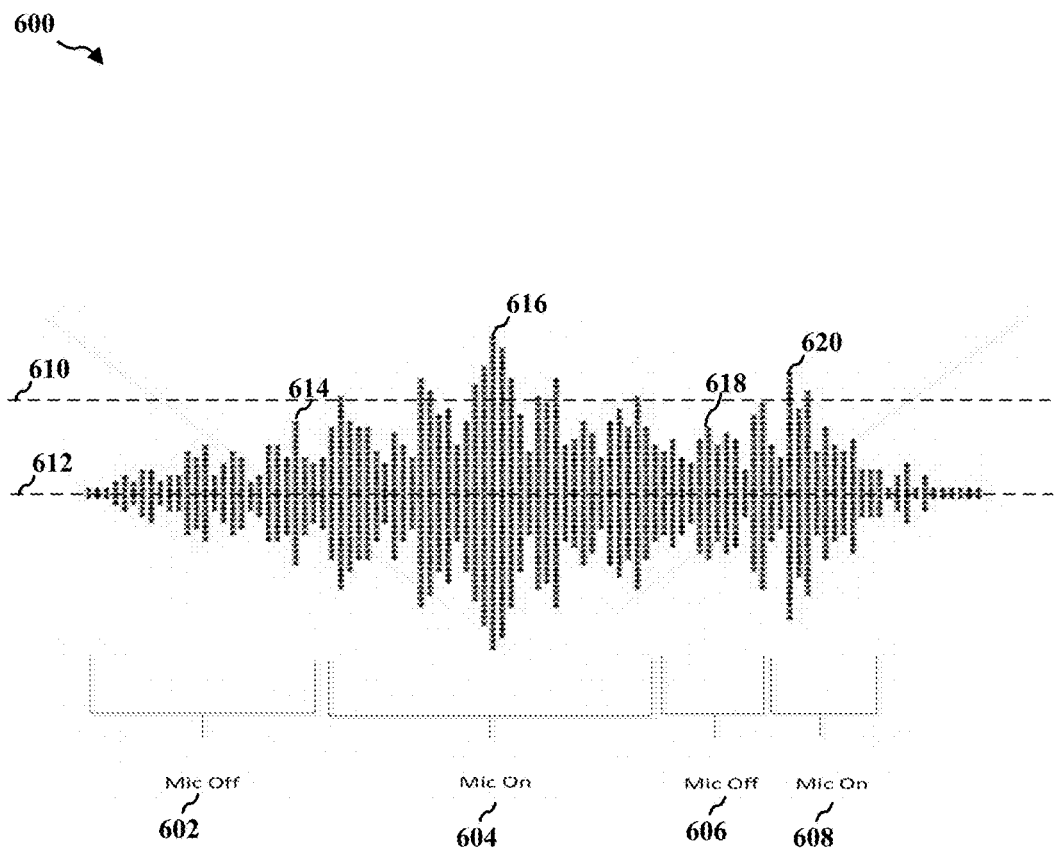
FIG. 6 is a diagram of a waveform that a device may use to determine to activate a microphone.

FIG. 6 is a diagram of a waveform 600 that a device may use to determine to activate a microphone. The waveform 600 may be associated with at least a segment of an audio file that a device may output through headphones. For example, the waveform 600 may represent at least a segment of an audio file that the device 406 may output through the speaker 412. The waveform 600 may be accessible to the device in advance of the outputting of the audio signal for the audio file. For example, the waveform 600 may be a digital representation of amplitude of an audio file.

In aspects, a segment may correspond to a duration—e.g., an amount of time. For example, a first segment 602 of the waveform 600 may be a plurality of seconds of at least one audio file. Thus, the amplitude reflects the pressure at a time during output of an audio signal (e.g., decibel (dB)).

In one aspect, the device 406 may selectively activate and deactivate the microphone based on the amplitude of the waveform 600. The amplitude of the waveform 600 may reflect the degree of change (positive or negative) in atmospheric pressure (the compression and rarefaction of air molecules) (e.g., in dB) caused by sound waves, in comparison to a baseline 612. In aspects, a segment may correspond to a duration—e.g., an amount of time. For example, a first segment 602 of the waveform 600 may be a plurality of seconds of at least one audio file. Thus, the amplitude reflects the pressure at a time during output of an audio signal.

A threshold 610 may be set in comparison to the baseline 612. The threshold 610 may be preconfigured, e.g., a stored value in the device 406, or the threshold 610 may be a configurable value.

In the context of FIG. 4, the device 406 may determine the waveform 600 as associated with an audio signal that is to be output through the speaker 412. For example, the device 406 may determine the waveform 600 of an audio file or a portion of an audio file (e.g., a music file, a video file, a voice memo, etc.) that is to be output through the speaker 412. The device 406 may determine a plurality of segments 602, 604, 606, 608 for the waveform 600, and each segment 602, 604, 606, 608 may include at least one peak 614, 616, 618, 620. A respective peak 614, 616, 618, 620 may represent a highest amplitude for a respective segment 602, 604, 606, 608 when that segment of an audio signal is being output.

For each segment 602, 604, 606, 608, the device 406 may compare a respective peak 614, 616, 618, 620 to the threshold 610. If a respective peak 614, 616, 618, 620 meets or exceeds the threshold 610, the device 406 may activate the microphone during that respective segment 602, 604, 606, 608 because the user 404 will likely experience difficulty hearing the relevant sound 420 during such segments.

Thus, at a first segment 602, the device 406 may determine a first peak 614, and because the first peak 614 does not meet or exceed the threshold 610, the device 406 may determine that the microphone 414 should be deactivated during the first segment 602. At a second segment 604, the device 406 may determine a second peak 616, and because the second peak 616 exceeds the threshold 610, the device 406 may determine that the microphone 414 should be activated during the second segment 604. At a third segment 606, the device 406 may determine a third peak 618, and because the third peak 616 does not meet or exceed the threshold 610, the device 406 may determine that the microphone 414 should be deactivated during the third segment 606. At a fourth segment 608, the device 406 may determine a fourth peak 620, and because the fourth peak 620 exceeds the threshold 610, the device 406 may determine that the microphone 414 should be activated during the fourth segment 608. In this way, the device 406 may selectively activate and deactivate the microphone 414 in order to monitor for the relevant sound 420.

Figure 7:
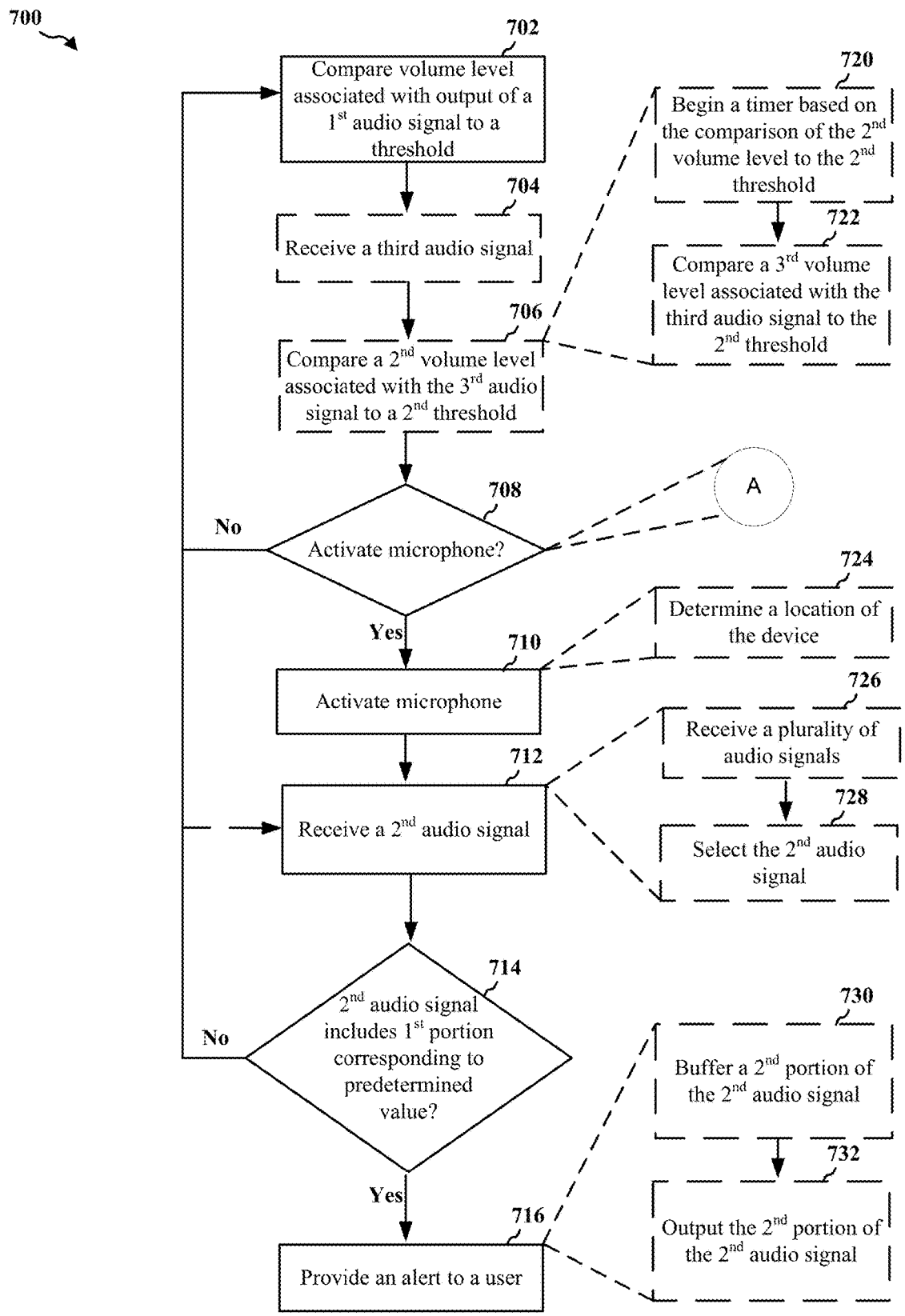
FIG. 7 is a flowchart of a method of alerting a user when a device is outputting an audio signal through headphones.

FIG. 7 is a flowchart of a method 700 of alerting a user when a device is outputting an audio signal through headphones. The method may be performed by a device (e.g., the UE 104, the device 406, the device 506, the apparatus 902/902'). Although FIG. 7 illustrates a plurality of operations, one of ordinary skill will appreciate that one or more operations may be transposed and/or contemporaneously performed. Further, one or more operations of FIG. 7 may be optional (e.g., as denoted by dashed lines) and/or performed in connection with one or more other operations.

Beginning first with operation 702, the device may compare a volume level associated with a first signal (e.g., a first signal output to headphones) to a first threshold. In the context of FIG. 4, the device 406 may determine a volume level of an audio signal output through the speaker 412 of the headphones 410. The device 406 may compare this output volume level to a predetermined threshold.

At operation 704, the device may receive a third audio signal. The third audio signal may be received through a microphone and may indicate ambient noise in the environment surrounding the device. In the context of FIG. 4, the device 406 may receive a third audio signal through the microphone 414 of the headphones 410.

At operation 706, the device may determine a second volume level associated with the third audio signal and may compare the second volume level to a second threshold. In the context of FIG. 4, the device 406 may determine the volume level of the audio signal received through the microphone 414 of the headphones 410. The device 406 may compare the received volume level to a second threshold.

In an aspect, operation 706 includes operations 720 and 722. At operation 720, the device may begin a timer based on the comparison of the second volume level to the second threshold. In the context of FIG. 4, the device 406 may begin a timer based on comparison of a second volume level associated with ambient noise received through the microphone 414.

At operation 722, the device may compare a third volume level associated with the third audio signal to the second threshold. For example, the device may determine whether to activate or deactivate a microphone periodically so that the device is not constantly monitoring volume levels of the ambient noise. In the context of FIG. 4, the device 406 may compare a third volume level associated with ambient noise received through the microphone 414 to the other threshold.

At operation 708, the device may determine whether to activate at least one microphone. The device determines whether to activate the microphone based at least on the comparison of the first volume level associated with the first audio signal output to the first threshold. For example, the device may determine to activate the microphone when the first volume level meets or exceeds the first threshold. Alternatively, the device may determine to refrain from activating or to deactivate the microphone when the first volume level does not meet or exceed the first threshold. In the context of FIG. 4, the device 406 may determine whether to activate the microphone 414 based on a comparison of the volume level associated with the audio signal output through the speaker 412.

In an aspect, the device may determine whether to activate the microphone further based on comparison of the second volume level associated with the third audio signal to a second threshold. For example, the device may determine to activate the microphone further based on ambient noise surrounding the device. If the ambient noise (received through the microphone) reflects a volume level that meets or exceeds a second threshold, then the device may determine that the microphone should be activated. Alternatively, the device may determine that the microphone should not be activated if the ambient noise does not reflect a volume level that meets or exceeds a second threshold. In the context of FIG. 4, the device 406 may determine whether to activate the microphone 414 based on comparison of a volume level associated with an audio signal received through the microphone 414 that reflects the ambient noise surrounding the device 406.

In an aspect, if the determination to activate the microphone based on the volume level associated with output of the first audio signal conflicts with the determination to activate the microphone based on the volume level associated with the ambient noise, one determination may be prioritized over another. For example, if at operation 702, the device determines that the microphone should be activated based on the volume level of the outputted audio signal, then the device may activate the microphone even if the volume level of the ambient noise does not meet or exceed the second threshold.

Figure 8:
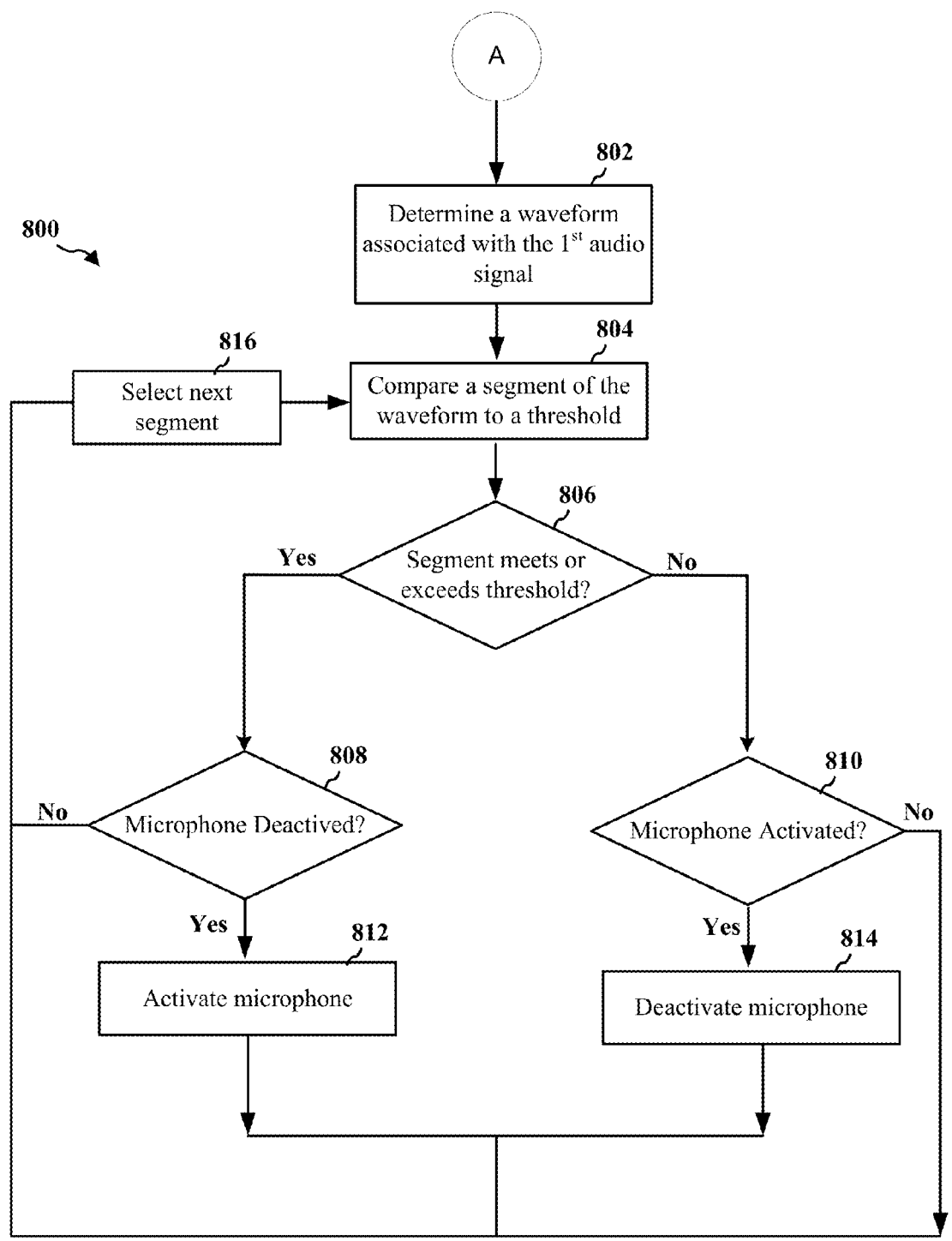
FIG. 8 is a flowchart of a method of activating a microphone based on a waveform.

In at least one aspect, operation 708 may include a plurality of operations described with respect to FIG. 8. For example, the device may determine that the microphone should be activated based on a volume level associated with output of the first audio signal. The device may then determine a waveform associated with the first audio signal (e.g., by accessing a stored digital waveform of an audio file or by converting an audio file to a digital waveform) and compare a plurality of segments of the waveform to an amplitude threshold. The device may then determine whether to deactivate the microphone based on the comparison of the plurality of segments of the waveform to the other threshold, as illustrated in the method 800.

If the device determines that the microphone should not be activated, the device may deactivate or refrain from activating the microphone and return to operation 702 (or another preceding operation). If the device determines that the microphone should be activated, the device may proceed to operation 710. At operation 710, the device may activate the microphone. In the context of FIG. 4, the device 406 may activate the microphone 414.

In an aspect, operation 710 further includes operation 724. At operation 724, the device may determine a location of the device. The device may determine whether to activate the microphone based on the location of the device (e.g., the device may not monitor for relevant sounds in all environments). In the context of FIG. 4, the device 406 may determine a location of the device 406 and determine whether to activate the microphone 414 based on the location of the location of the device 406. The device 406 may determine whether the location occurs in a set of locations stored in the device 406 (e.g., a list configured by a user, a preconfigured list, etc.) and, if so, the device 406 may activate the microphone 414.

With the microphone activated, the method 700 may proceed to operation 712. At operation 712, the device may receive, through the microphone, a second audio signal. This second audio signal may include ambient noise and, at one point, may include a relevant sound. In the context of FIG. 4, the device 406 may receive, through the microphone 414, an audio signal reflecting the ambient noise, which may include the relevant sound.

In an aspect, operation 712 may include operations 726 and 728. In one aspect, the device may be communicatively coupled with the a plurality of microphones. Because one microphone may be occluded, the device may be configured to select one of the microphones to use for detection of a relevant sound. Thus, at operation 726, the device may receive a plurality of audio signals from a plurality of different microphones. In the context of FIG. 4, the device 406 may receive a respective audio signal from a respective one of the first microphone 414 and the second microphone 430.

At operation 728, the device may select the second audio signal to monitor for a relevant sound. For example, the device may measure a first volume or noise level received through the first microphone and also measure a second volume or noise level received through the second microphone, and the device 406 may select the one of the microphones having a greater volume or noise level, which may indicate less occlusion. In another example, the device may attempt to convert to a text pattern a first audio signal received through the first microphone and, similarly, convert to a text pattern a second audio signal received through the second microphone. The device may determine which conversion is more accurate or more likely to be correct and select the corresponding one of the microphones. In the context of FIG. 4, the device 406 may select the first microphone 414 instead of the second microphone 430.

At operation 714, the device may determine whether the second audio signal includes a first portion that corresponds to a predetermined value—that is, the device may determine whether the ambient noise includes a relevant sound (e.g., a name of a user, an announcement, and the like). In an aspect, the device may be configured to convert the voice from the second audio signal to a text pattern (e.g., a string value or an array of characters). The device may be configured to compare the received text pattern to one or more stored values that are text patterns. If the device determines that the received text pattern corresponds to at least one stored text pattern, the device may proceed to operation 716. If the device determines that the ambient noise does not correspond to a predetermined value (e.g., the text pattern does not correspond to a predetermined value or no conversion of the ambient noise to a text pattern is possible), then the device may return to any of the proceedings operations, such as operation 702, operation 708, or operation 712. In the context of FIG. 4, the device 406 may determine whether an audio signal received through the microphone 414 includes the relevant sound 420.

At operation 716, the device may generate an alert indicating that a relevant sound has been detected in the ambient noise that corresponds to a predetermined value. In an aspect, the device may alert the user by reducing a volume or stopping output of the first audio signal output through the headphones. In another aspect, the device may alert the user by presenting a visual alert on a display of the device. In another aspect, the device may alert the user by causing a light associated with the headphones and/or the device to flash. In another aspect, the device may alert the user by causing the device and/or the headphones to vibrate. In the context of FIG. 4, the device 406 may provide an alert to the user 404 when the relevant sound 420 is detected.

In one aspect, operation 716 includes operation 730 and operation 732. In an aspect, the device may alert the user by playing back at least a portion of the audio signal received through the microphone. Thus, at operation 732, the device may buffer the second audio signal received through the microphone. In the context of FIG. 4, the device 406 may buffer the received audio signal (e.g., when determining whether the received audio signal includes the relevant sound 420).

At operation 732, the device may alert the user by outputting a second portion of the second audio signal through the headphones. That is, when the device determines that the received audio signal corresponds to a predetermined value, the device may play back at least a portion of the buffered audio through the headphones (including at least the relevant sound). In the context of FIG. 4, the device 406 may output at least a portion of the received audio signal through the speaker 412, including at least a portion of the relevant sound 420.

FIG. 8 is a flowchart of a method 800 of activating a microphone based on a waveform. The method may be performed by a device (e.g., the UE 104, the device 406, the device 506, the apparatus 902/902'). Although FIG. 8 illustrates a plurality of operations, one of ordinary skill will appreciate that one or more operations may be transposed and/or contemporaneously performed. Further, one or more operations of FIG. 8 may be optional (e.g., as denoted by dashed lines) and/or performed in connection with one or more other operations.

In an aspect, the method 800 may include one or more operations to be performed with the method 700. For example, the method 800 may include a plurality of operations to be performed in association with the operation to activate a microphone, as illustrated at operation 708. However, the method 800 may be performed independently from the method 700.

Beginning first with operation 802, the device may determine a waveform associated with a first audio signal. In aspects, the first audio signal may be an audio signal that is output through headphones or speakers that are communicatively coupled with the device. In an aspect, the device may be configured to determine the waveform prior to outputting the first audio signal associated with the waveform and, therefore, the device may perform one or more operations based on a segment of the waveform before a segment of the first audio signal corresponding to that segment of the waveform is output. For example, the audio signal of an audio file may be digitized and the digital waveform may be divided into a plurality of segments of equal or varying length. In the context of FIG. 4, the device 406 may be configured to determine a waveform associated with an audio signal to be output through the speaker 412 of the headphones 410. In the context of FIG. 6, the device may determine the waveform 600.

At operation 804, the device may compare a first segment of the waveform to a threshold. The first segment of the waveform may reflect an amplitude corresponding to a first segment of the audio signal to be output by the device. The waveform may have one or more peaks reflecting a relatively large amplitude corresponding to that first segment of the audio signal. A threshold may be set in comparison to a baseline amplitude (e.g., a stored and/or configurable value). The device may compare one or more peaks associated with the first segment of the waveform to the threshold. In the context of FIG. 4, the device 406 may compare, to a threshold, a first segment of the waveform determined for an audio signal to be output through the speaker 412. In the context of FIG. 6, the device may compare at least one peak 614 of the first segment 602 to a threshold 610. Similarly, the device may compare at least one peak 616 of a second segment 604 to the threshold 610.

If the segment does not meet or exceed the threshold, as illustrated at operation 806, the device may proceed to operation 810. At operation 810, the device may determine if the microphone is activated. In the context of FIG. 4, the device 406 may determine if the microphone 414 is activated.

If the microphone is activated, the device may proceed to operation 814. At operation 814, the device may deactivate an activated microphone. Because a segment having a peak that does not meet or exceed a threshold may indicate that the a user wearing headphones may be able to hear ambient noise even during output of the first audio signal, the device may deactivate the microphone, for example, to conserve resources of the device. The device may then proceed to operation 816 of the method 800. In the context of FIG. 4, the device 406 may deactivate the microphone 414. In the context of FIG. 6, the device may deactivate the microphone during the first segment 602 because the first peak 614 does not meet or exceed the threshold 610.

If the microphone is not activated, the device may proceed to operation 816. Because a segment having a peak that does not meet or exceed a threshold may indicate that a user wearing headphones may be able to hear ambient noise even during output of the first audio signal, the device may keep the microphone in a deactivated state, for example, to conserve resources of the device. In the context of FIG. 4, the device 406 may cause the microphone 414 to remain deactivated (e.g., by performing no operations). In the context of FIG. 6, the device may cause the microphone to remain deactivated during the first segment 602 because the first peak 614 does not meet or exceed the threshold 610.

At operation 816, the device may select a next segment of a waveform. Thus, the device may progress through segments of one or more waveforms to selectively activate and/or deactivate a microphone of the device. In the context of FIG. 4, the device 406 may select a next segment of a waveform associated with an audio signal that is to be output through the speaker 412. In the context of FIG. 6, the device may select another segment (e.g., the second segment 604, the third segment 606, the fourth segment 608), which the device may then compare to the threshold, as shown at operation 804.

Returning to operation 806, if the segment meets or exceeds the threshold, the device may proceed to operation 808. At operation 808, the device may determine if the microphone is deactivated. In the context of FIG. 4, the device 406 may determine if the microphone 414 is deactivated.

If the microphone is deactivated, the device may proceed to operation 816. Because a segment having a peak that meets or exceeds a threshold may indicate that the a user wearing headphones may be unable to hear ambient noise during output of the first audio signal, the device may keep a microphone in an activated state, for example, to continue monitoring for a relevant sound. In the context of FIG. 4, the device 406 may cause the microphone 414 to remain activated.

If in operation 808 the microphone is not activated, the device may proceed to operation 812. Because a segment having a peak that meets or exceeds a threshold may indicate that the a user wearing headphones may be unable to hear ambient noise during output of the first audio signal, the device may activate the microphone, for example, to monitor for a relevant sound. The device may then proceed to operation 816 of the method 800. In the context of FIG. 4, the device 406 may cause the microphone 414 to remain deactivated (e.g., by performing no operations). In the context of FIG. 6, the device may activate the microphone during the second segment 604 because the second peak 616 exceeds the threshold 610.

At operation 816, the device may select a next segment of a waveform. Thus, the device may progress through segments of one or more waveforms to selectively activate and/or deactivate a microphone of the device. In the context of FIG. 4, the device 406 may select a next segment of a waveform associated with an audio signal that is to be output through the speaker 412. In the context of FIG. 6, the device may select another segment (e.g., the second segment 604, the third segment 606, the fourth segment 608), which the device may then compare to the threshold, as shown at operation 804.

In various aspects, the device may determine times at which to activate and/or deactivate the microphone in advance of outputting the audio signal corresponding to the waveform. For example, at the beginning of an audio file, the device may determine one or more time values at which the microphone is to be activated and the duration for which the microphone should remain activated. Accordingly, the device may activate the microphone at each time value and deactivate the microphone at the expiration of each duration.

By way of example, in the context of FIG. 6, the first segment 602 may correspond to the first minute of an audio file, the second segment 604 may correspond to the second minute of the audio file, the third segment 606 may correspond to the third minute of the audio file, and the fourth segment 608 may correspond to the fourth minute of the audio file. The device may determine that the microphone should be activated after the first minute and after the third minute. Accordingly, as the device outputs the audio signal associated with the waveform 600, the device may activate the microphone after the first minute of output, deactivate the microphone after the second minute of output, and again activate the microphone after the third minute of output.

Figure 9:
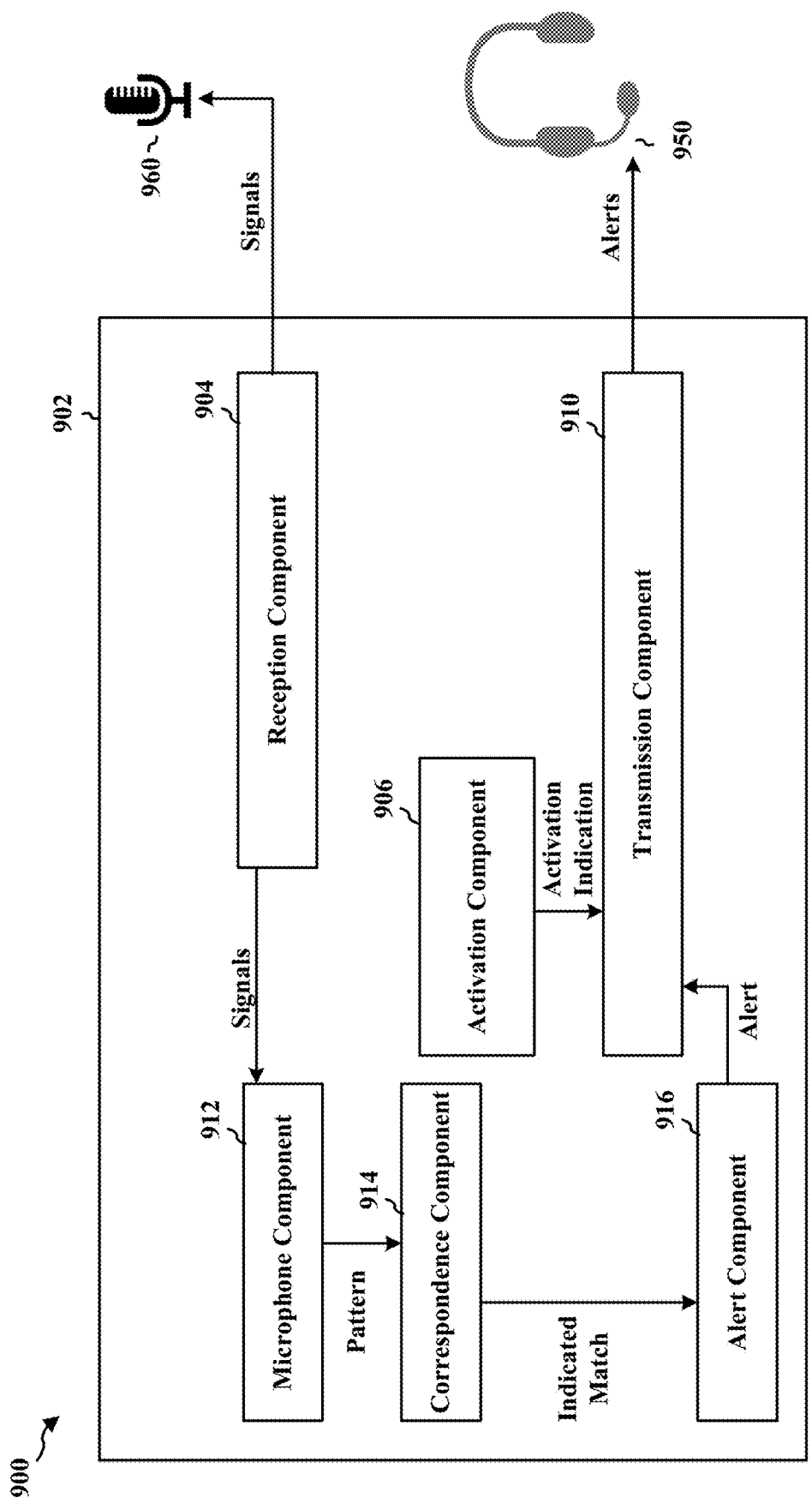
FIG. 9 is a conceptual data flow diagram illustrating the data flow between different means/components in an exemplary apparatus.

FIG. 9 is a conceptual data flow diagram 900 illustrating the data flow between different means/components in an exemplary apparatus 902. The apparatus may be a device, such as the UE 104, the device 406, and/or the device 506.

The apparatus includes a reception component 904 that is configured to receive signals from a microphone 960 communicatively coupled with the apparatus 902. In an aspect, the reception component 904 is configured to provide audio signals to a microphone component 912.

The microphone component 912 may be configured to process a received audio signal, such as an audio signal that includes ambient noise. In an aspect, the microphone component 912 may be configured to detect or isolate voice audio from ambient noise. In another aspect, the microphone component 912 may attempt to convert at least a portion of a received audio signal to a text pattern. For example, the microphone component 912 may detect or isolate voice audio from ambient noise audio in the received audio signal, and attempt to convert the voice audio to a text pattern (e.g., using a voice-to-text conversion algorithm). The microphone component 912 may be configured to provide a pattern (e.g., the converted text pattern or an isolated voice pattern) to a correspondence component 914.

The correspondence component 914 may be configured to compare the pattern to one or more stored values. Based on the comparison, the correspondence component 914 may be configured to determine whether the pattern corresponds to (e.g., matches) at least one stored value. Thus, the correspondence component 914 may be configured to determine whether the ambient noise received through the microphone 960 includes at least one relevant sound to which the user should be alerted. The correspondence component 914 may be configured to provide an indication of the match to an alert component 916.

The alert component 916 may be configured to determine at least one alert based on the indicated match. The alert component 916 may be configured to generate the alert based on the determined alert. In an aspect, the alert component 916 may generate an alert that causes a reduction in a volume of audio signal output through the headphones 950 or stopping the output of the audio signal through the headphones 950. In another aspect, the alert component 916 may generate an alert that causes presentation of a visual alert on a display communicatively coupled to the apparatus 902. In another aspect, the alert component 916 may generate the alert by causing the vibration of a housing associated with the apparatus 902.

In one aspect, the alert component 916 may generate the alert by playing back at least a portion of the audio signal received through the microphone 960 through the headphones 950. For example, the alert component 916 may buffer the received audio signal and, when the correspondence component 914 determines that the received audio signal corresponds to one or more stored values, the alert component 916 may cause play back of at least a portion of the buffered audio through the headphones 950. In some aspects, the alert component 916 may be configured to provide the generated alert to the transmission component 910. The transmission component 910 may provide the alert to the headphones 950.

In aspects, the apparatus 902 may include an activation component 906 that may be configured to selectively activate and/or deactivate the microphone 960, for example, so that the microphone component 912 is not constantly processing received audio signals. According to aspects, the activation component 906 may be configured to determine a volume level associated with an audio signal output through the headphones 950. The activation component 906 may be configured to compare this volume level to a threshold.

Based on the comparison of the volume level to the threshold, the activation component 906 may be configured to either activate or deactivate the microphone 960.

In one aspect, the activation component 906 may selectively activate and deactivate the microphone based on the amplitude of an audio signal that is to be output through the headphones 950. In one aspect, the activation component 906 may determine a waveform associated with an audio signal that is to be output through the headphones 950. For example, the activation component 906 may determine a waveform of an audio file or a portion of an audio file (e.g., a music file, a video file, a voice memo, etc.). The activation component 906 may be configured to compare at least one peak of at least one segment of the waveform to a threshold. If the activation component 906 determines that the at least one peak meets or exceeds the threshold, the activation component 906 may cause the microphone 960 to be activated during output of a segment of the audio signal corresponding to the segment of the waveform. If the activation component 906 determines that the at least one peak does not meet or exceed the threshold, the activation component 906 may cause the microphone 960 to be deactivated during output of a segment of the audio signal corresponding to the segment of the waveform.

The apparatus may include additional components that perform each of the blocks of the algorithm in the aforementioned flowcharts of FIGS. 7 and 8. As such, each block in the aforementioned flowcharts of FIGS. 7 and 8 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 10:
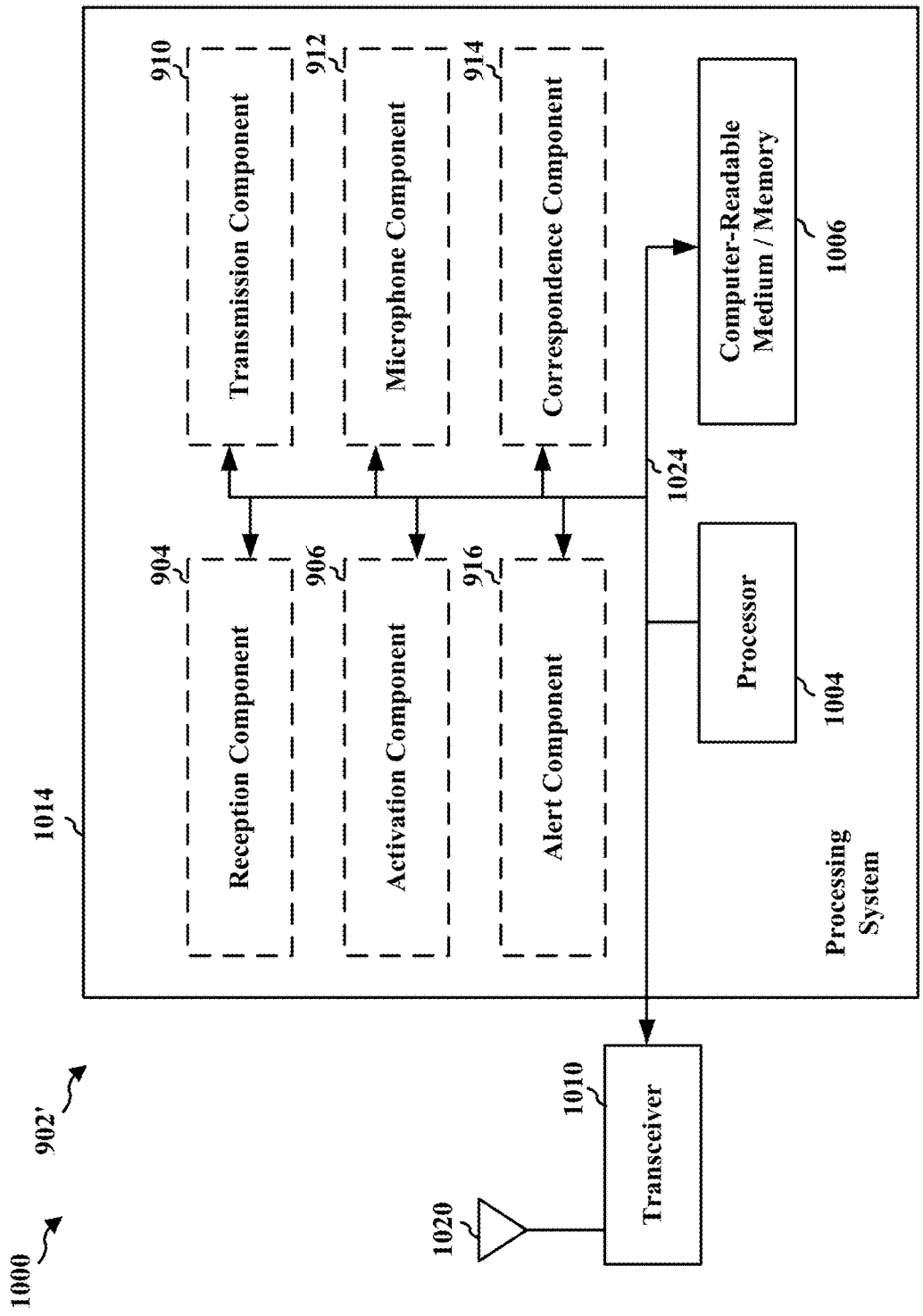
FIG. 10 is a diagram illustrating an example of a hardware implementation for an apparatus employing a processing system.

FIG. 10 is a diagram 1000 illustrating an example of a hardware implementation for an apparatus 902' employing a processing system 1014. The processing system 1014 may be implemented with a bus architecture, represented generally by the bus 1024. The bus 1024 may include any number of interconnecting buses and bridges depending on the specific application of the processing system 1014 and the overall design constraints. The bus 1024 links together various circuits including one or more processors and/or hardware components, represented by the processor 1004, the components 904, 906, 910, 912, 914, 916, and the computer-readable medium/memory 1006. The bus 1024 may also link various other circuits such as timing sources, peripherals, voltage regulators, and power management circuits, which are well known in the art, and therefore, will not be described any further.

The processing system 1014 may be coupled to a transceiver 1010. The transceiver 1010 is coupled to one or more antennas 1020. The transceiver 1010 provides a means for communicating with various other apparatus over a transmission medium. The transceiver 1010 receives a signal from the one or more antennas 1020, extracts information from the received signal, and provides the extracted information to the processing system 1014, specifically the reception component 904. In addition, the transceiver 1010 receives information from the processing system 1014, specifically the transmission component 910, and based on the received information, generates a signal to be applied to the one or more antennas 1020. The processing system 1014 includes a processor 1004 coupled to a computer-readable medium/memory 1006. The processor 1004 is responsible for general processing, including the execution of software stored on the computer-readable medium/memory 1006. The software, when executed by the processor 1004, causes the processing system 1014 to perform the various functions described supra for any particular apparatus. The computer-readable medium/memory 1006 may also be used for storing data that is manipulated by the processor 1004 when executing software. The processing system 1014 further includes at least one of the components 904, 906, 910, 912, 914, 916. The components may be software components running in the processor 1004, resident/stored in the computer readable medium/memory 1006, one or more hardware components coupled to the processor 1004, or some combination thereof. The processing system 1014 may be a component of the UE 350 and may include the memory 360 and/or at least one of the TX processor 368, the RX processor 356, and the controller/processor 359.

In one configuration, the apparatus 902/902' for wireless communication includes means for <all means limitations>. The aforementioned means may be one or more of the aforementioned components of the apparatus 902 and/or the processing system 1014 of the apparatus 902' configured to perform the functions recited by the aforementioned means. As described supra, the processing system 1014 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of processing an audio signal by a device, the method comprising:
   comparing a volume level to a threshold, the volume level associated with output of a first audio signal by the device;
   receiving a third audio signal;
   comparing a second volume level associated with the third audio signal to a second threshold; and
   activating a microphone communicatively coupled to the device based on the comparison of the volume level to the threshold and based on the comparison of the second volume to the second threshold,
   wherein when the microphone is activated:
      receiving, through the microphone, a second audio signal when the device is outputting the first audio signal;
      determining that the second audio signal includes a first portion that corresponds to a predetermined value; and
      providing an alert to a user of the device based on the determination that the second audio signal includes the first portion that corresponds to the predetermined value.

2. The method of claim 1, further comprising:
   beginning a timer based on the comparison of the second volume level to the second threshold; and
   comparing a third volume level associated with the third audio signal to the second threshold.

3. The method of claim 1, further comprising:
   receiving a plurality of audio signals, including the second audio signal, through a plurality of microphones communicatively coupled to the device; and
   selecting the second audio signal.

4. The method of claim 1, further comprising:
   determining a location of the device,
   wherein the activation of the microphone is further based on the determined location.

5. The method of claim 1, wherein the alert includes one of a visual alert, an audio alert, or a vibration alert.

6. The method of claim 5, wherein providing the audio alert comprises one of reducing the volume level associated with outputting the first audio signal or stopping output of the first audio signal.

7. The method of claim 6, wherein providing the alert further comprises:
   playing at least a second portion of the second audio signal through headphones communicatively coupled to the device after stopping or reducing output of the first audio signal.

8. The method of claim 7, wherein the second portion includes the first portion, and the method further comprises:
   buffering the second portion of the second audio signal when determining that the second audio signal includes the first portion that corresponds to the predetermined value.

9. The method of claim 1, further comprising:
   determining a waveform associated with the first audio signal;
   comparing a plurality of segments of the waveform to another threshold; and
   deactivating the microphone based on the comparison of the plurality of segments of the waveform to the other threshold.

10. An apparatus for processing an audio signal, the apparatus comprising:
    means for comparing a volume level to a threshold, the volume level associated with output of a first audio signal by the apparatus;
    means for receiving a third audio signal;
    means for comparing a second volume level associated with the third audio signal to a second threshold; and
    means for activating a microphone communicatively coupled to the apparatus based on the comparison of the volume level to the threshold and based on the comparison of the second volume to the second threshold;
    means for receiving, through the activated microphone, a second audio signal when the apparatus is outputting the first audio signal;
    means for determining that the second audio signal includes a first portion that corresponds to a predetermined value; and
    means for providing an alert to a user of the apparatus based on the determination that the second audio signal includes the first portion that corresponds to the predetermined value.

11. The apparatus of claim 10, further comprising:
    means for beginning a timer based on the comparison of the second volume level to the second threshold; and
    means for comparing a third volume level associated with the third audio signal to the second threshold.

12. The apparatus of claim 10, wherein the means for receiving the second audio signal is further configured to:
    receive a plurality of audio signals, including the second audio signal, through a plurality of microphones communicatively coupled to the apparatus; and
    select the second audio signal.

13. The apparatus of claim 10, wherein the means for activating the microphone is configured to determine a location of the apparatus, and wherein the activation of the microphone is further based on the determined location.

14. The apparatus of claim 10, wherein the alert includes one of a visual alert, an audio alert, or a vibration alert.

15. The apparatus of claim 14, wherein the means for providing the alert is configured to reduce a volume level associated with outputting the first audio signal or stop output of the first audio signal.

16. The apparatus of claim 15, wherein the means for providing the alert is configured to play at least a second portion of the second audio signal through headphones communicatively coupled to the apparatus after stopping or reducing output of the first audio signal.

17. The apparatus of claim 16, wherein the second portion includes the first portion, and the means for providing the alert is further configured to buffer the second portion of the second audio signal when determining that the second audio signal includes the first portion that corresponds to the predetermined value.

18. The apparatus of claim 10, wherein the means for activating a microphone is configured to:
    determine a waveform associated with the first audio signal;

compare a plurality of segments of the waveform to another threshold; and deactivate the microphone based on the comparison of the plurality of segments of the waveform to the other threshold.

19. An apparatus for processing an audio signal, the apparatus comprising:

a memory; and at least one processor coupled to the memory and configured to:

compare a volume level to a threshold, the volume level associated with output of a first audio signal by the apparatus;

receive a third audio signal;

compare a second volume level associated with the third audio signal to a second threshold;

activating a microphone communicatively coupled to the apparatus based on the comparison of the volume level to the threshold and based on the comparison of the second volume to the second threshold; and when the microphone is activated:

receive, through the microphone, a second audio signal when the apparatus is outputting the first audio signal;

determine that the second audio signal includes a first portion that corresponds to a predetermined value; and provide an alert to a user of the apparatus based on the determination that the second audio signal includes the first portion that corresponds to the predetermined value.

20. The apparatus of claim 19, wherein the at least one processor is further configured to:

begin a timer based on the comparison of the second volume level to the second threshold; and compare a third volume level associated with the third audio signal to the second threshold.

21. The apparatus of claim 19, wherein the at least one processor is further configured to:

receive a plurality of audio signals, including the second audio signal, through a plurality of microphones communicatively coupled to the apparatus; and select the second audio signal.

22. The apparatus of claim 19, wherein the at least one processor is further configured to:

determine a location of the apparatus, wherein the activation of the microphone is further based on the determined location.

23. The apparatus of claim 19, wherein the alert includes one of a visual alert, an audio alert, or a vibration alert.

24. The apparatus of claim 23, wherein the at least one processor is configured to provide the audio alert by reducing a volume level associated with outputting the first audio signal or stopping output of the first audio signal.

25. The apparatus of claim 24, wherein the at least one processor is configured to provide the audio alert by playing at least a second portion of the second audio signal through headphones communicatively coupled to the apparatus after stopping or reducing output of the first audio signal.

26. The apparatus of claim 19, wherein the at least one processor is configured to:

determine a waveform associated with the first audio signal;

compare a plurality of segments of the waveform to another threshold; and deactivate the microphone based on the comparison of the plurality of segments of the waveform to the other threshold.

27. A non-transitory computer-readable medium storing computer executable code, comprising code to:

compare a volume level to a threshold, the volume level associated with output of a first audio signal by a device;

receive a third audio signal;

compare a second volume level associated with the third audio signal to a second threshold;

activate a microphone communicatively coupled to the device based on the comparison of the volume level to the threshold and based on the comparison of the second volume to the second threshold; and when the microphone is activated:

receive, through the microphone, a second audio signal when the device is outputting the first audio signal;

determine that the second audio signal includes a first portion that corresponds to a predetermined value; and provide an alert to a user of the device based on the determination that the second audio signal includes the first portion that corresponds to the predetermined value.

* * * * *